(12) United States Patent
Mori et al.

(10) Patent No.: US 7,888,988 B2
(45) Date of Patent: Feb. 15, 2011

(54) FUSE CIRCUIT

(75) Inventors: Kenji Mori, Kanagawa (JP); Masayuki Takori, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 25 days.

(21) Appl. No.: 12/185,837

(22) Filed: Aug. 5, 2008

(65) Prior Publication Data

US 2009/0039946 A1 Feb. 12, 2009

(30) Foreign Application Priority Data

Aug. 6, 2007 (JP) ............................. 2007-204077

(51) Int. Cl.
*G11C 17/16* (2006.01)
*H03K 17/18* (2006.01)
(52) U.S. Cl. ...................... 327/525; 365/96; 365/225.7
(58) Field of Classification Search ................. 327/525
See application file for complete search history.

(56) References Cited

U.S. PATENT DOCUMENTS

| 4,730,129 | A | * | 3/1988 | Kunitoki et al. ............. 327/525 |
|---|---|---|---|---|
| 5,384,746 | A | * | 1/1995 | Giolma ..................... 365/225.7 |
| 5,418,487 | A | * | 5/1995 | Armstrong, II .............. 327/525 |
| 5,748,031 | A | * | 5/1998 | Best ........................... 327/525 |
| 6,054,893 | A | * | 4/2000 | Singh ......................... 327/525 |
| 6,246,243 | B1 | * | 6/2001 | Audy ......................... 324/550 |
| 6,535,438 | B2 | * | 3/2003 | Ariki ......................... 365/200 |
| 6,710,640 | B1 | * | 3/2004 | Kothandaraman et al. ... 327/525 |
| 6,859,090 | B2 | * | 2/2005 | Liu ............................. 327/525 |
| 7,254,080 | B2 | * | 8/2007 | Kimura ................... 365/225.7 |
| 7,554,869 | B2 | | 6/2009 | Kim et al. |
| 7,688,613 | B2 | * | 3/2010 | Chung et al. ................. 365/96 |
| 2005/0146965 | A1 | | 7/2005 | Kim et al. |
| 2009/0040804 | A1 | * | 2/2009 | Mori et al. .................... 365/96 |

FOREIGN PATENT DOCUMENTS

JP 2005-332964 12/2005
KR 10-2005-0063880 6/2005

* cited by examiner

*Primary Examiner*—Lincoln Donovan
*Assistant Examiner*—Terry L Englund
(74) *Attorney, Agent, or Firm*—Young & Thompson

(57) ABSTRACT

A fuse circuit includes a first power supply line, a second power supply line, a first current source connected between the first power supply line and an output terminal, a second current source connected between the second power supply line and the output terminal, the second current source having higher current supply capacity or current draw-out capacity than the first current source, and a fuse connected in series with the second current source between the second power supply line and the output terminal.

10 Claims, 17 Drawing Sheets

OUTPUT LOGIC OF STORAGE CIRCUIT USING NAND GATE
(REMEDIAL SIGNAL IS H WHEN RESET SIGNAL IS H)

| STATE OF FUSE | LOGIC OF REMEDIAL SIGNAL |
|---|---|
| CUT | H |
| UNCUT | L |

Fig. 2

SETTING OF TRANSISTOR SIZE RATIO OF EACH TRANSISTOR BY DIFFERENCE IN POSITION TO CONNECT FUSE

| RELATIONSHIP OF OUTPUT CURRENT WHEN FUSE IS CONDUCTING | TRANSISTOR TO WHICH FUSE IS CONNECTED | | | |
|---|---|---|---|---|
| | Tr2 | Tr3 | Tr4 | Tr5 |
| Io1<Io2 | 1) W1:W2:W3=1:N:1<br>W4:W5=1:1<br>2) W1:W2:W3=1:1:1/N<br>W4:W5=1:1<br>3) W1:W2:W3=1:1:1<br>W4:W5=1:N | 1) W1:W2:W3=1:1:N<br>W4:W5=1:1<br>2) W1:W2:W3=1:1:1/N<br>W4:W5=1:1<br>3) W1:W2:W3=1:1:1<br>W4:W5=1:1/N | — | 1) W1:W2:W3=1:1:1<br>W4:W5=1:N<br>2) W1:W2:W3=1:N:1<br>W4:W5=1:1<br>3) W1:W2:W3=1:1:1<br>W4:W5=1:1 |
| Io1>Io2 | — | — | 1) W1:W2:W3=1:1:N<br>W4:W5=1:1<br>2) W1:W2:W3=1:1/N:1<br>W4:W5=1:1<br>3) W1:W2:W3=1:1:1<br>W4:W5=1:1/N | — |

Fig. 5

OUTPUT LOGIC OF STORAGE CIRCUIT USING NOR GATE
(REMEDIAL SIGNAL IS H WHEN RESET SIGNAL IS H)

| STATE OF FUSE | LOGIC OF REMEDIAL SIGNAL |
|---|---|
| CUT | L |
| UNCUT | H |

RELATIONSHIP BETWEEN TRANSISTOR TO WHICH FUSE IS
CONNECTED AND TRANSISTOR TO WHICH RESISTOR IS CONNECTED

| TRANSISTOR TO WHICH FUSE IS CONNECTED | TRANSISTOR TO WHICH RESISTOR IS CONNECTED |
|---|---|
| Tr2 | Tr4, Tr5 |
| Tr3 | Tr4, Tr5 |
| Tr4 | Tr1, Tr2, Tr3 |
| Tr5 | Tr1, Tr2, Tr3 |

Fig. 11

FUSE CIRCUIT

BACKGROUND OF THE INVENTION

1. Field of the Invention

The present invention relates to a fuse circuit and, particularly, to a fuse circuit which determines the cut state of a fuse by the operation of a current mirror circuit.

2. Description of Related Art

The number of devices that are formed on one semiconductor chip is ever increasing This causes difficulty in manufacturing all devices without any defect, which leads to a decrease in manufacturing yield. In light of this, there is proposed a semiconductor chip that replaces a defective device with a redundant device which is formed on the same chip to relieve the defective chip. The circuit in which such replacement is made uses a state storage device such as a fuse and selects whether to use an existing device or a redundant device according to the uncut/cut state of the device. Further, such a circuit uses a fuse circuit which determines the uncut/cut state of a fuse. An example of the fuse circuit is disclosed in Japanese Unexamined Patent Application Publication No. 2005-332964 (which is hereinafter referred to as a related art).

FIG. 18 shows a circuit diagram of a fuse circuit 100 which is described in the related art. Referring to FIG. 18, the fuse circuit 100 includes transistors Q1-Q6, which are grouped as circuits 110-112, to produce currents I11-I14 and an inverter X1. The current I12 and current I14 which are supplied to an output terminal DET through current mirror circuits 111 and 112. The fuse circuit 100 sets the magnitude relationship between the current I12 and the current I14 based on the resistance ratio between a fuse F10 and a resistor R10. When the fuse F10 is uncut, the resistance of the fuse F10 is sufficiently lower than the resistance of the resistor R10, and when it is cut, the resistance of the fuse F10 is sufficiently higher than the resistance of the resistor R10. Accordingly, when the fuse F10 is uncut, the current I14 is larger than the current I12, and when it is cut, the current I12 is larger than the current I14. In this way, the magnitude relationship between the current I12 and the current I14 is reversed according to the uncut/cut state of the fuse F10, so that the potential of the output terminal DET is inverted. A circuit in the subsequent state can thereby determine the uncut/cut state of the fuse from the potential of the output terminal DET.

However, the fuse F10 can be connected again after it is cut in some cases. If the reconnection occurs in the fuse F10, the resistance of the fuse F10 becomes lower than the resistance when it is cut. Accordingly, the current I12 and the current I14 may not have a desired magnitude relationship in some cases where the resistance of the fuse F10 after the reconnection and the resistance of the resistor R10 are in certain relationship. Further, the resistance of the resistor R10 varies in the manufacturing process. If the resistance varies significantly, the relationship between the resistance of the fuse F10 and the resistance of the resistor R10 does not have a desired ratio. Due to such issues, there is the probability of wrong determination of the uncut/cut state of the fuse F10 in the fuse circuit 100.

SUMMARY

According to an embodiment of the present invention, there is provided a fuse circuit which includes a first power supply line, a second power supply line, a first current source connected between the first power supply line and an output terminal, a second current source connected between the second power supply line and the output terminal, the second current source having higher current supply capacity or current draw-out capacity than the first current source, and a fuse connected in series with the second current source between the second power supply line and the output terminal.

The fuse circuit according to the embodiment of the present invention sets a voltage value of the output terminal by supply current or drawn-out current of the first current source when the fuse is uncut, and it sets a voltage value of the output terminal by supply current or drawn-out current of the second current source when the fuse is cut. It is thereby possible to reliably set the voltage value of the output terminal even when reconnection of the fuse occurs after the fuse cutting.

The fuse circuit according to the embodiment of the present invention can reliably determine the uncut/cut state of the fuse.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a table showing the output logic of a storage circuit according to the first embodiment;

FIG. 5 is a table showing the relationship between a transistor to which a fuse is connected and a transistor size ratio according to the first embodiment;

FIG. 11 is a table showing the relationship between a transistor to which a fuse is connected and a transistor to which a resistor is connected according to the second embodiment;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
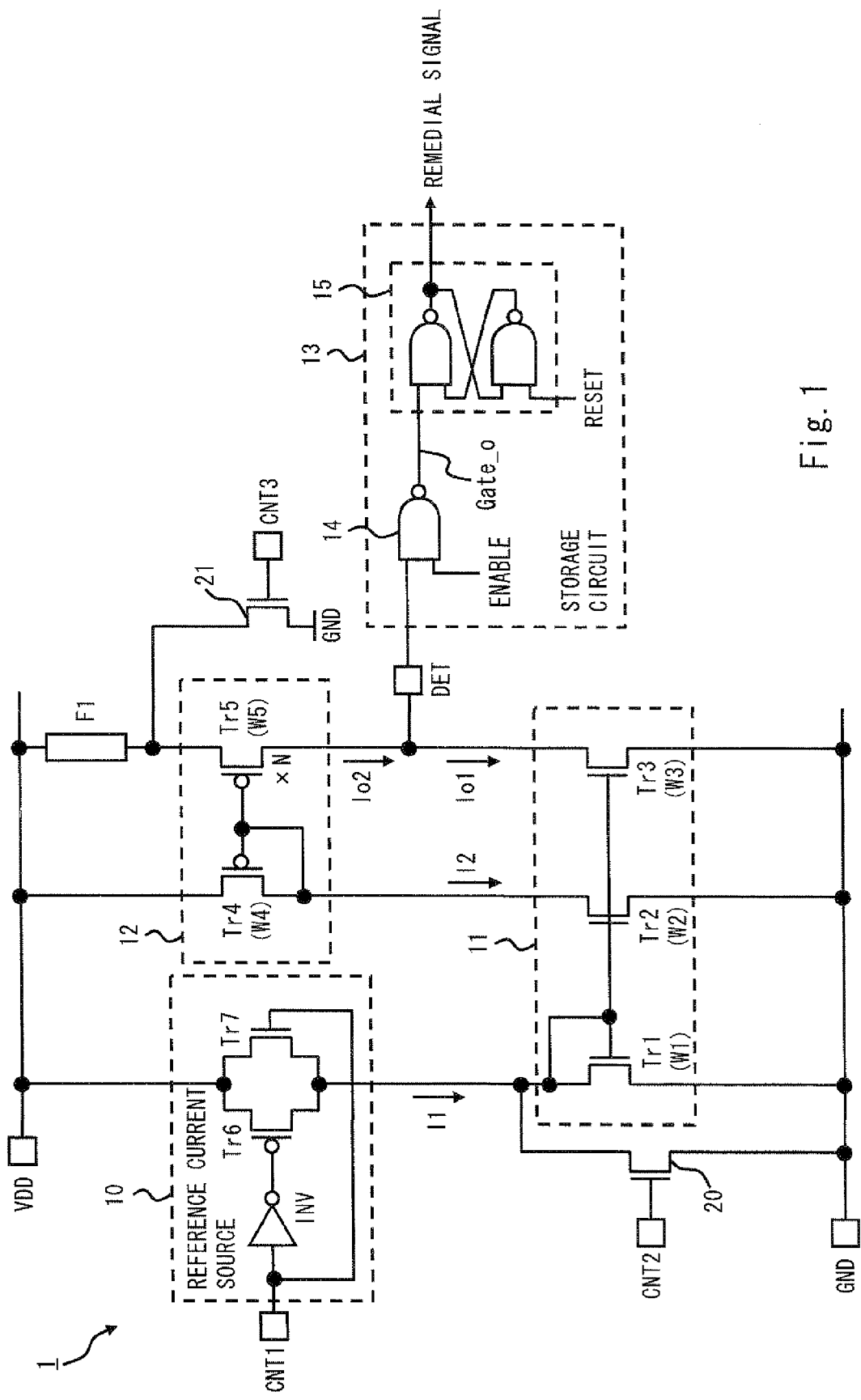
FIG. 1 is a circuit diagram of a fuse circuit according to a first embodiment of the present invention.

An embodiment of the present invention is described hereinafter with reference to the drawings. FIG. 1 shows a circuit diagram of a fuse circuit 1 according to a first embodiment of the present invention. Referring to FIG. 1, the fuse circuit 1 includes a reference current source 10, a first current source (e.g. first current mirror) 11, a second current source (e.g. second current mirror) 12, a storage circuit 13, an output terminal DET, a fuse F1, a current mirror control transistor 20, and a fuse cutting transistor 21.

The reference current source 10 includes a PMOS transistor Tr6, an NMOS transistor Tr7, and an inverter INV. The PMOS transistor Tr6 and the NMOS transistor Tr7 form a transfer gate. The transfer gate is connected between a second power supply line (which is hereinafter referred to as a power supply line VDD) and the first current mirror 11. A current control signal from a control terminal CNT1 is input through the inverter INV to a control terminal (hereinafter referred to as a gate) of the PMOS transistor Tr6, and a current control signal from the control terminal CNT1 is input directly to the gate of the NMOS transistor Tr7. The reference current source 10 generates reference current I1 based on the resistance of the transistors when the transfer gate is conducting.

The first current mirror 11 includes first to third transistors. In this embodiment, an NMOS transistor Tr1 is used as the first transistor, an NMOS transistor Tr2 is used as the second transistor, and an NMOS transistor Tr3 is used as the third transistor. In the NMOS transistor Tr1, the reference current I1 which is output from the reference current source 10 is input to a second terminal (hereinafter referred to as a drain). In the NMOS transistor Tr1, the drain and the gate are commonly connected, and a first terminal (hereinafter referred to as a source) is connected to a first power supply line (hereinafter referred to as a ground line GND) through a line such as a metal line. The gates of the NMOS transistors Tr2 and Tr3 are commonly connected to the gate of the NMOS transistor Tr1. The NMOS transistor Tr2 outputs intermediate current I2 from the drain, and the source is connected to the ground line GND through a line such as a metal line. The NMOS transistor Tr3 outputs first output current Io1 from the drain, and the source is connected to the ground line GND through a line such as a metal line. The current mirror control transistor (an NMOS transistor is used in this embodiment) 20 is connected between the drain of the NMOS transistor Tr1 and the ground line GND. A current mirror control signal is input to the gate of the current mirror control transistor 20 from a control terminal CNT2.

The second current mirror 12 includes fourth and fifth transistors. In this embodiment, a PMOS transistor Tr4 is used as the fourth transistor, and a PMOS transistor Tr5 is used as the fifth transistor. The PMOS transistor Tr5 has such a size that a transistor size ratio with respect to the PMOS transistor Tr4 is N. The transistor size ratio is represented as the ratio of a gate length L and a gate width W (W/L) of the transistor if it is a MOS transistor. Thus, the ratio which is represented as (W/L) of the PMOS transistor Tr5 is N times the ratio of the PMOS transistor Tr4. The symbols W1 to W5 in FIG. 1 indicate the size ratio of each transistor.

The drain of the PMOS transistor Tr4 is connected to the drain of the NMOS transistor Tr2 and receives the intermediate current I2. The drain and the gate of the PMOS transistor Tr4 are commonly connected, and the source is connected to the power supply line VDD through a line such as a metal line. The gate of the PMOS transistor Tr5 is commonly connected to the gate of the PMOS transistor Tr4. The source of the PMOS transistor Tr5 is connected to the power supply line VDD via the fuse F1. The PMOS transistor Tr5 outputs second output current Io2 from the drain. The drain of the PMOS transistor Tr5 is connected to the drain of the NMOS transistor Tr3, and the output terminal DET is connected to a note between the drains. The fuse cutting transistor (an NMOS transistor is used in this embodiment) 21 is connected between a node of the source of the PMOS transistor Tr5 and the fuse F1 and the ground line GND. A fuse cutting control signal is input to the gate of the fuse cutting transistor 21 from a control terminal CNT3.

The storage circuit 13 is connected to the output terminal DET. The storage circuit 13 includes an NAND gate 14 and a latch circuit 15. In the NAND gate 14, a first input terminal is connected to the output terminal DET, and an ENABLE signal is input to a second input terminal. When the ENABLE signal is in the enabling state (e.g. High level), the NAND gate 14 outputs a logic level which is the inversion of a signal level that is input to the first input terminal, and when the ENABLE signal is in the blocking state (e.g. Low level), the NAND gate 14 fixes the output to High level. In the following description, an output signal from the NAND gate 14 is referred to as a gating output signal Gate_o. In the latch circuit 15, a first input terminal is connected to the NAND gate 14, and a RESET signal is input to a second input terminal. If a falling edge from High level to Low level is input to the first input terminal of the latch circuit 15 when the RESET signal is in the reset release state (e.g. Low level), for example, the latch circuit 15 sets the output to Low level. The latch circuit 15 maintains the Low level output even if the signal level of the first input terminal becomes High level. Further, if the first input terminal does not change from High level when the RESET signal is in the reset release state, the latch circuit 15 maintains the High level output. On the other hand, when the RESET signal becomes the reset state (e.g. High level), the latch circuit 15 resets the output to High level. FIG. 2 is the table which shows the output logic of the storage circuit 13. Referring to FIG. 2, the storage circuit 13 outputs High level when the fuse is cut, and it outputs Low level when the fuse is uncut in this embodiment.

Figure 3:
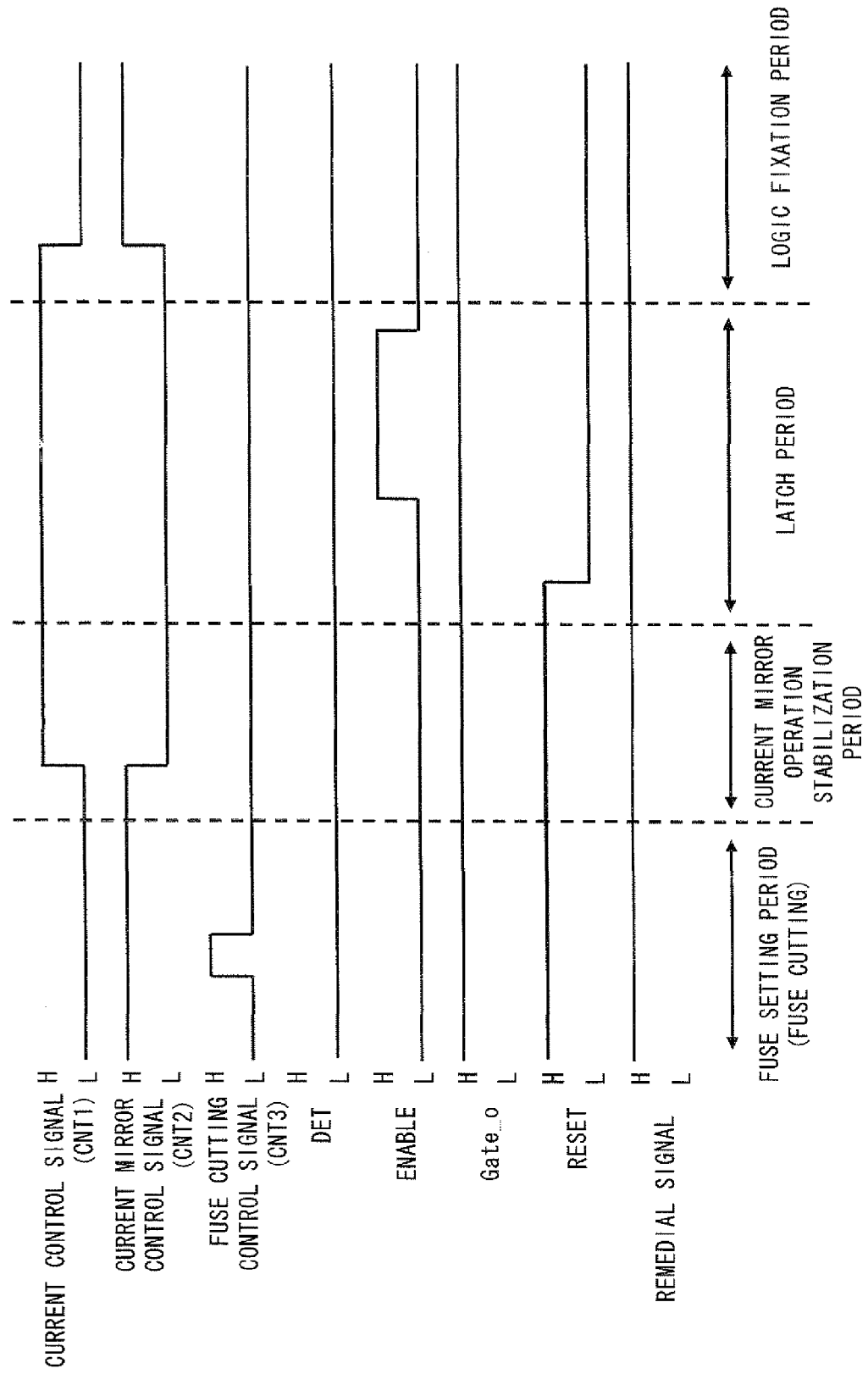
FIG. 3 is a timing chart showing operation of cutting a fuse and operation of detecting a cut fuse in the fuse circuit according to the first embodiment.
Figure 4:
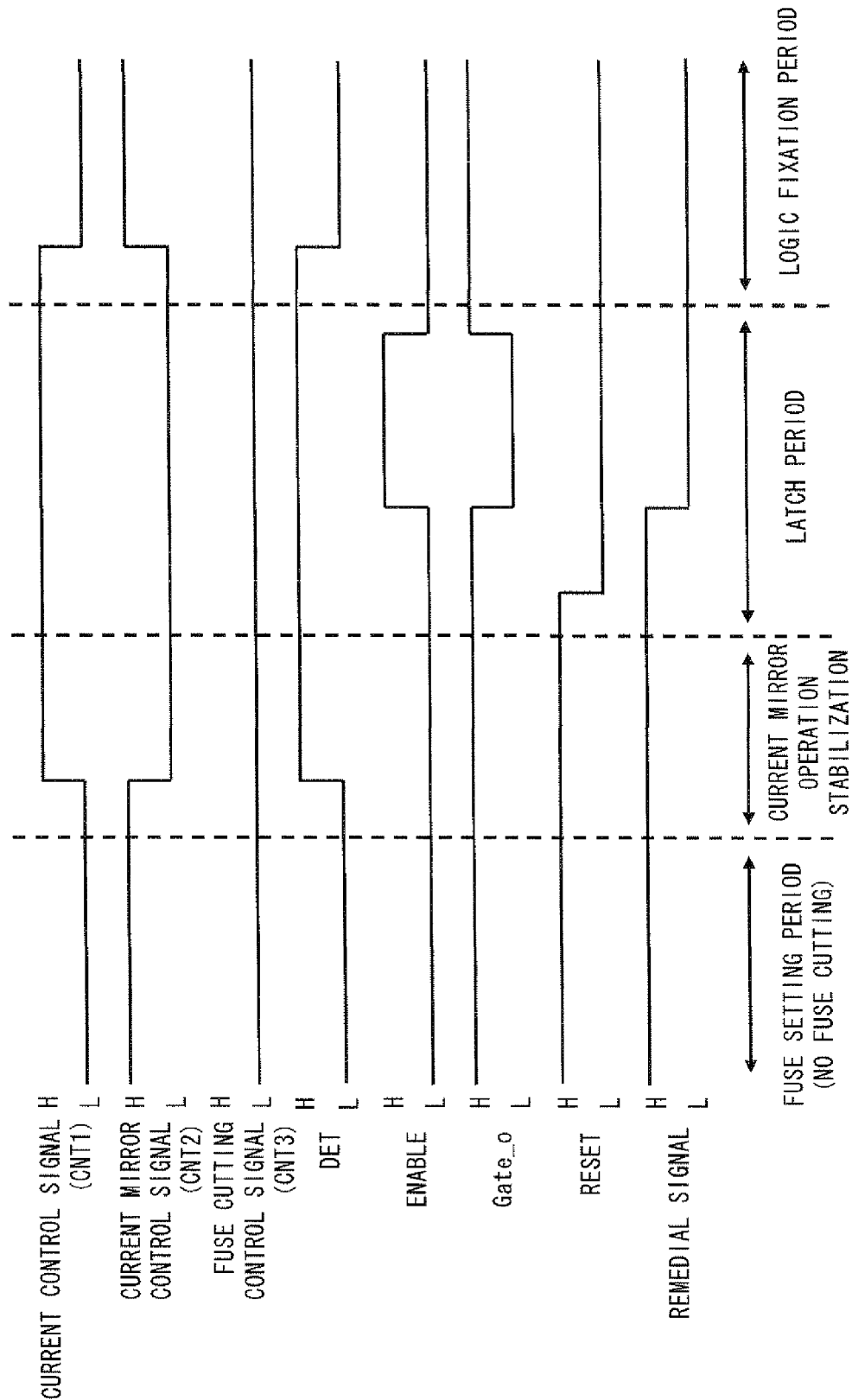
FIG. 4 is a timing chart showing operation of detecting an uncut fuse in the fuse circuit according to the first embodiment.

The operation of the fuse circuit 1 is described hereinafter. FIGS. 3 and 4 are the timing charts which show the operation of the fuse circuit 1. The timing chart in FIG. 3 shows the case of cutting the fuse F1 in the fuse circuit 1 and detecting the state of the cut fuse F1. The timing chart in FIG. 4 shows the case of not cutting the fuse F1 in the fuse circuit 1 and detecting that the fuse F1 is uncut.

Referring first to the timing chart in FIG. 3, the operation of cutting the fuse F1 and the operation of detecting the cut fuse F1 are described hereinbelow. As shown in FIG. 3, the operation of cutting the fuse F1 is performed in a fuse setting period which is set before detecting the state of the fuse F1. When cutting the fuse F1, the fuse cutting control signal is set to High level during a predetermined length of time. While the fuse cutting control signal is at High level, the fuse cutting transistor 21 is conducting. The current thereby flows into the fuse F1 to cut the fuse F1. On the other hand, because the first current mirror 11 and the second current mirror 12 do not need to operate, the current control signal is set to Low level, so that the transfer gate of the reference current source 10 is nonconducting. Further, in order to prevent the malfunction of the current mirror, the current mirror control signal is set to High level, so that the current mirror control transistor 20 is conducting. The voltages of the gate, source and drain terminals of the NMOS transistor Tr1 thereby become the ground voltage, and the first current mirror 11 becomes the non-operating state. After cutting the fuse F1, the fuse cutting control signal becomes Low level. The resistance of the fuse F1 in the cut state is significantly higher than the resistance in the uncut state.

Next, the first current mirror 11 and the second current mirror 12 are activated. The period until the operation of the first current mirror 11 and the second current mirror 12 is stabilized is referred to as a current mirror operation stabilization period. In the current mirror operation stabilization period, the current control signal is switched from Low level to High level, and the current mirror control signal is switched from High level to Low level. The reference current source 10 thereby starts operating and generates the reference current I1. Further, because the current mirror control transistor 20 becomes non-conducting, the first current mirror 11 and the second current mirror 12 start operating. On the other hand, because the fuse cutting control signal is Low level, the fuse cutting transistor 21 is non-conducting.

At this time, the first current mirror 11 outputs the intermediate current I2 and the first output current Io1 based on the reference current I1 and the size ratio of the NMOS transistor Tr1 to the NMOS transistor Tr3. In this embodiment, the relationship of the current is: I1=I2=Io1. On the other hand, the second current mirror 12 outputs the second output current Io2 based on the intermediate current I2 and the size ratio of the PMOS transistor Tr4 and the PMOS transistor Tr5. However, because the fuse F1 is cut in this mode, the potential of the source of the PMOS transistor Tr5 decreases due to the resistance of the fuse F1 when the current is fed to the PMOS transistor Tr5. Accordingly, a potential difference which is large enough for the transistor to operate sufficiently is not generated between the source and the gate of the PMOS transistor Tr5. Consequently, the second output current Io2 does not substantially flow. Since Io2=0 and Io1=I1, the current which is supplied to the output terminal DET is Io2−Io1=−I1. The determination voltage of the output terminal DET is thereby the ground voltage (Low level).

Then, the determination voltage of the output terminal DET is captured by the storage circuit 13. The period which is used for the capture is referred to as a latch period. In the latch period, the RESET signal is switched from High level to Low level to enter the reset release state. After that, the ENABLE signal is switched from Low level to High level to enter the enabling state. In the example of FIG. 3, because the determination voltage is Low level, the gating output signal Gate_o which is output from the NAND gate 14 stays High level. Thus, the voltage level of the first input terminal of the latch circuit 15 does not change in spite of being the reset release state, and a remedial signal which is output from the latch circuit 15 stays High level. At the end of the latch period, the ENABLE signal changes from High level to Low level to enter the blocking state. The output of the latch circuit 15 is thereby not affected by a subsequent change in the determination voltage. Further, the reset release state of the RESET signal is kept after the latch period as well, thereby maintaining the output of the latch circuit 15.

The period after the fuse cut state is captured by the storage circuit 13 is referred as a logic fixation period. In the logic fixation period, the current control signal is set to Low level, and the current mirror control signal is set to High level. The reference current I1 which is supplied to the first current mirror 11 and the second current mirror 12 is thereby blocked, and the first current mirror 11 and the second current mirror 12 stop operating. Accordingly, the storage circuit 13 holds High level and stores the fuse cut state while the current which is consumed in the first current mirror 11 and the second current mirror 12 is blocked.

Referring then to the timing chart in FIG. 4, the operation of detecting the uncut state of the fuse F1 is described hereinbelow. As shown in FIG. 4, the fuse cutting control signal stays Low level during the fuse setting period. The fuse cutting transistor 21 is thereby non-conducting, so that the fuse F1 stays uncut. On the other hand, because the first current mirror 11 and the second current mirror 12 do not need to operate, the current control signal is set to Low level, so that the transfer gate of the reference current source 10 is non-conducting. Further, in order to prevent the malfunction of the current mirror, the current mirror control signal is set to High level, so that the current mirror control transistor 20 is conducting. The voltages of the gate, source and drain terminals of the NMOS transistor Tr1 thereby become the ground voltage, and the first current mirror 11 becomes the non-operating state.

Next, the first current mirror 11 and the second current mirror 12 are activated in the current mirror operation stabilization period. In the current mirror operation stabilization period, the current control signal is switched from Low level to High level, and the current mirror control signal is switched from High level to Low level. The reference current source 10 thereby starts operating and generates the reference current I1. Further, because the current mirror control transistor 20 becomes non-conducting, the first current mirror 11 and the second current mirror 12 start operating.

At this time, the first current mirror 11 outputs the intermediate current I2 and the first output current Io1 based on the reference current I1 and the size ratio of the NMOS transistor Tr1 to the NMOS transistor Tr3. In this embodiment, the relationship of the current is: I1=I2=Io1. On the other hand, the second current mirror 12 outputs the second output current Io2 based on the intermediate current I2 and the size ratio of the PMOS transistor Tr4 and the PMOS transistor Tr5. Because the transistor size of the PMOS transistor Tr5 is N times (N>1) the size of the PMOS transistor Tr4, the relationship between the intermediate current I2 and the second output current Io2 is Io2=N×I2. Accordingly, Io2=N×I1 and Io1=I1, and therefore the current which is supplied to the output terminal DET is Io2−Io1=(N−1)×I1. The determination voltage of the output terminal DET is thereby the power supply voltage (High level).

Then, the determination voltage of the output terminal DET is captured by the storage circuit 13 in the latch period. In the latch period, the RESET signal is switched from High level to Low level to enter the reset release state. After that, the ENABLE signal is switched from Low level to High level to enter the enabling state. In the example of FIG. 4, because the determination voltage is High level, the gating output signal Gate_o which is output from the NAND gate 14 changes from High level to Low level. Accordingly, the voltage level of the first input terminal of the latch circuit 15 changes, and the remedial signal which is output from the latch circuit 15 changes from High level to Low level. At the end of the latch period, the ENABLE signal changes from High level to Low level to enter the blocking state. The output of the latch circuit 15 is thereby not affected by a subsequent change in the determination voltage. Further, the reset release state of the RESET signal is kept after the latch period as well, thereby maintaining the output of the latch circuit 15.

In the example of FIG. 4 also, in the logic fixation period, the current control signal is set to Low level, and the current mirror control signal is set to High level. The reference current I1 which is supplied to the first current mirror 11 and the second current mirror 12 is thereby blocked, and the first current mirror 11 and the second current mirror 12 stop operating. Accordingly, the storage circuit 13 holds High level and stores the fuse uncut state while the current which is consumed in the first current mirror 11 and the second current mirror 12 is blocked.

Although the case where the fuse F1 is connected between the source of the PMOS transistor Tr5 and the power supply line VDD is described in the above embodiment, the fuse F1 may be connected between the source of the NMOS transistor Tr2, Tr3 and the ground line GND or between the source of the PMOS transistor Tr4 and the power supply line VDD. Further, the size ratio of each transistor may be also altered. FIG. 5 shows an example of a difference in the transistor to which the fuse F1 is connected and the kinds of setting of the transistor size ratio. As shown in FIG. 5, in each case where the fuse F1 is connected to any transistor, the transistor size ratio is set in such a way that the magnitude relationship of the output current is inverted by fuse cutting. Further, it is necessary to appropriately change the connection of the fuse cutting transistor in accordance with the connected portion of the fuse F1. In the case where the fuse F1 is connected to the PMOS transistor Tr4, the magnitude relationship of the output current is inverted compared with the other cases. Specifically, the logic of the output terminal DET which determines the uncut state and the cut state of the fuse F1 is inverted compared with that in the other cases. It is therefore necessary to replace the NAND gate 14 of the storage circuit 13 with an AND gate.

The fuse F1 has substantially the same resistance as the metal line in the uncut state, and it has the significantly higher resistance (e.g. the resistance that is higher than the resistance of the metal line by double figures or larger) than the metal line in the cut state. In order to determine the cut state of the fuse F1, the fuse circuit 1 connects the source of the transistor whose gate is commonly connected to the transistor to which the fuse F1 is connected by a line such as a metal line, and sets the magnitude relationship between the first output current Io1 and the second output current Io2 by the transistor size ratio. Further, even if the fuse F1 is reconnected after it is cut, the resistance does not become substantially the same as the resistance of the metal line. Accordingly, the fuse circuit 1 can reliably determine the cut state of the fuse F1 without the inversion of the magnitude relationship between the first output current Io1 and the second output current Io2 even if the fuse F1 is reconnected. The fuse circuit 1 according to this embodiment sets the voltage value of the output terminal by the supply current or the drawn-out current of the first current source when the fuse is uncut, and it sets the voltage value of the output terminal by the supply current or the drawn-out current of the second current source when the fuse is cut. Accordingly, the fuse circuit 1 reverses the relationship between the current supply capacity or the current draw-out capacity of the first current source and the current supply capacity or the current draw-out capacity of the second current source depending on whether the fuse is cut or uncut. It is thereby possible to reliably set the voltage value of the output terminal even when the reconnection of the fuse occurs after the fuse cutting.

Further, in the fuse circuit 1, the storage circuit 13 is connected to the output terminal DET so as to hold the determination result and output it to a subsequent circuit. The reference current source 10 is capable of stopping the output of reference current. The fuse circuit 1 is thereby capable of blocking the current which is supplied to the current mirror after the determination of the uncut/cut state of the fuse F1 so as to reduce the current consumption in the current mirror. Thus, the fuse circuit 1 can reduce the power consumption after determining the uncut/cut state of the fuse F1.

Figures 6, 7:
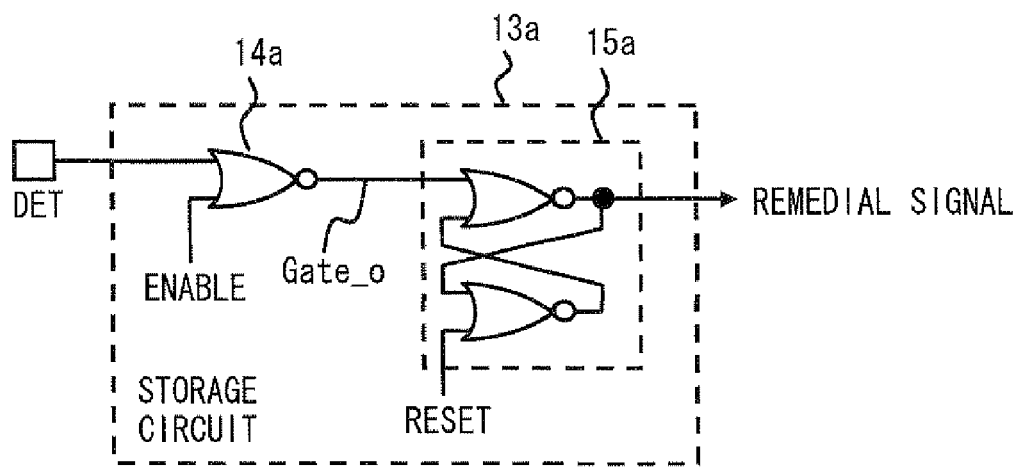
FIG. 6 is a circuit diagram of another example of a storage circuit according to the first embodiment.
FIG. 7 is a table showing the output logic of another example of a storage circuit according to the first embodiment.

The output logic of the storage circuit 13 may be inverted. FIG. 6 is the circuit diagram of a storage circuit 13*a* which is used in the case of inverting the output logic of the storage circuit 13. Referring to FIG. 6, the storage circuit 13*a* includes a NOR gate 14*a* and a latch circuit 15*a* which is composed of a NOR gate. The latch circuit 15*a* substitutes the NOR gate for the NAND gate of the latch circuit 15. FIG. 7 is a table which shows the output logic of the storage circuit 13*a*. Referring to FIG. 7, the storage circuit 13*a* outputs Low level when the fuse F1 is cut, and it outputs High level when the fuse F1 is uncut.

Figure 8:
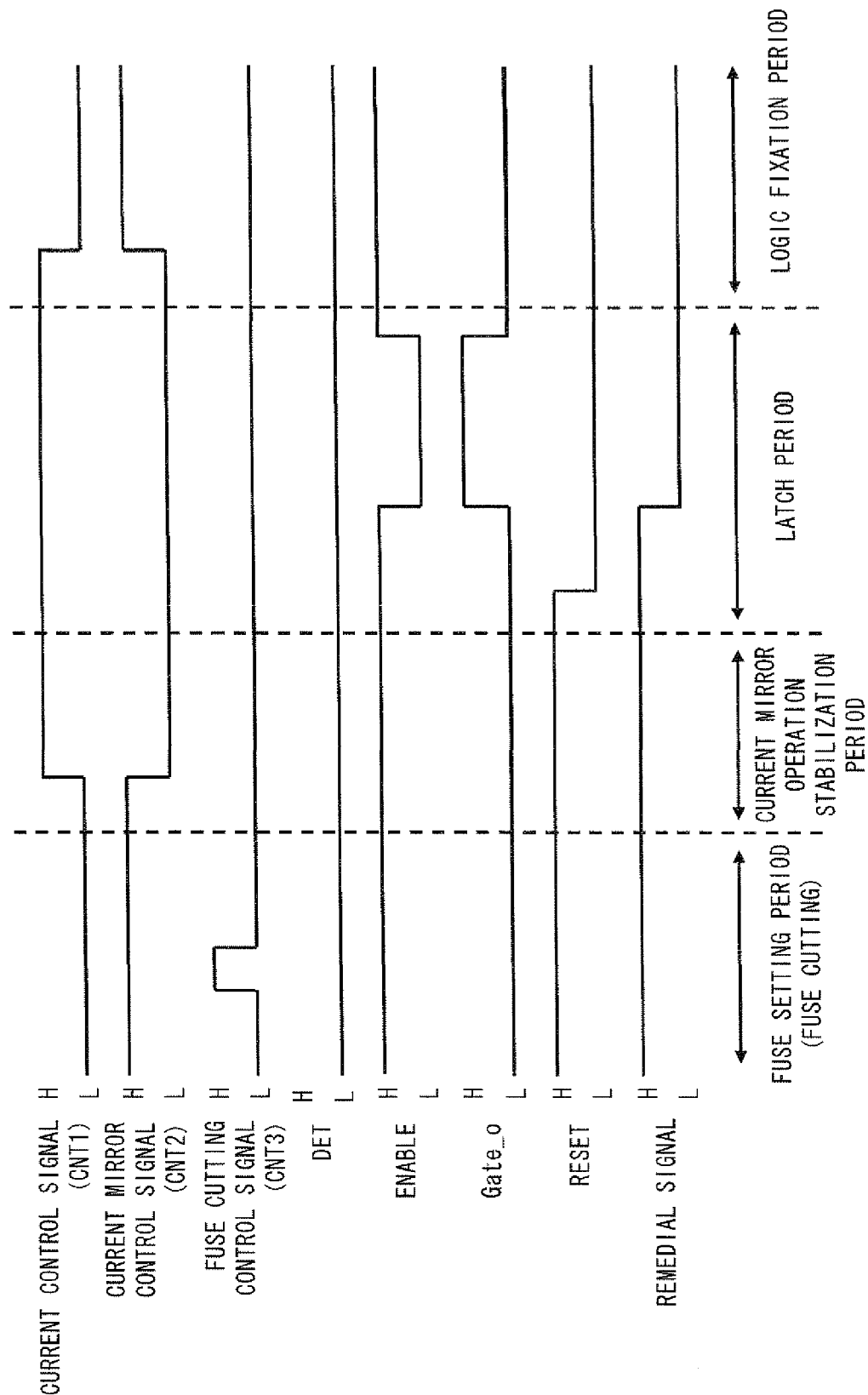
FIG. 8 is a timing chart showing operation of cutting a fuse and operation of detecting a cut fuse in the fuse circuit where another example of a storage circuit is used according to the first embodiment.
Figure 9:
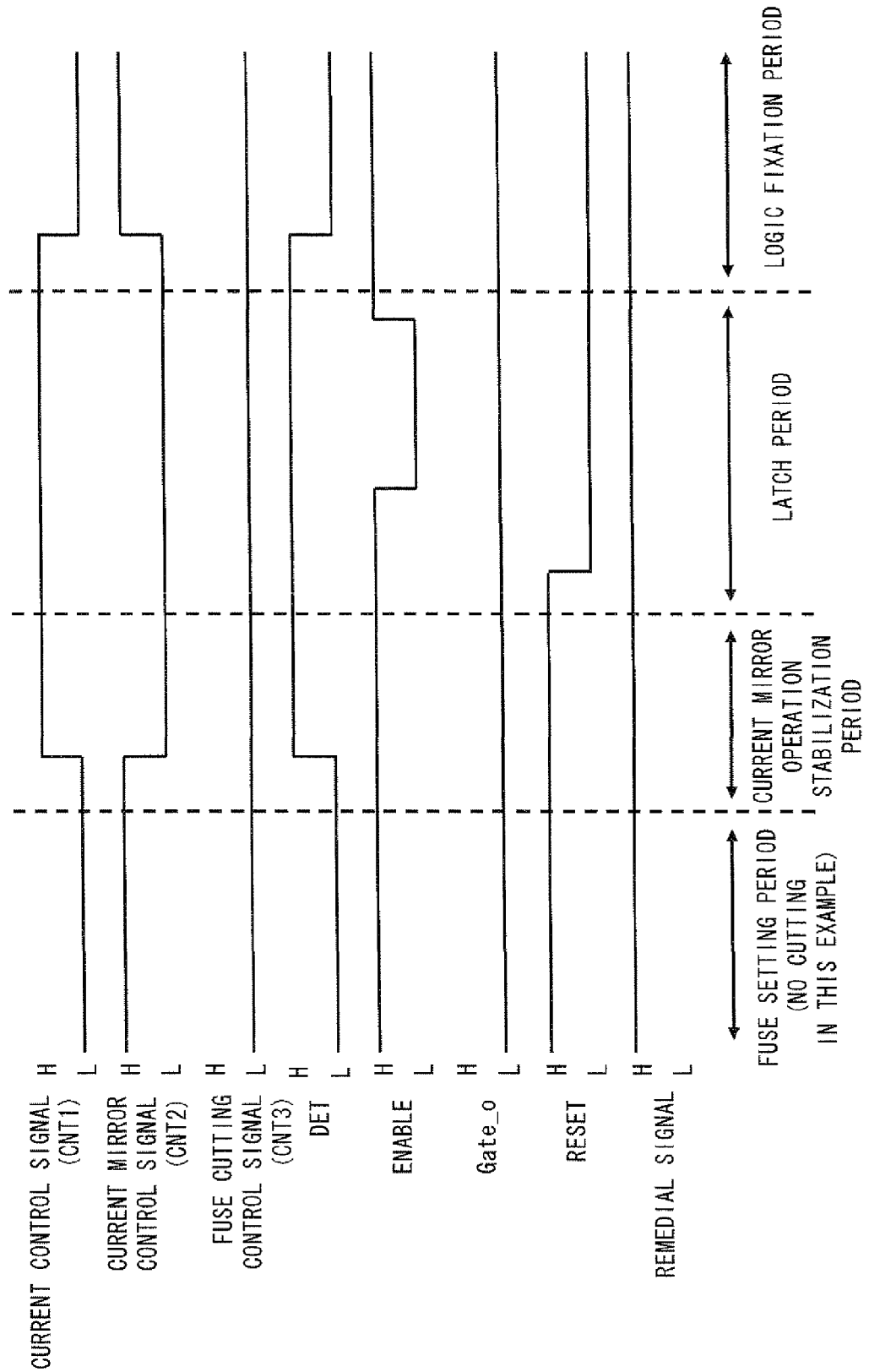
FIG. 9 is a timing chart showing operation of detecting an uncut fuse in the fuse circuit where another example of a storage circuit is used according to the first embodiment.

FIGS. 8 and 9 are the timing charts showing the operation of the fuse circuit 1 in the case of using the storage circuit 13*a*. Differences between the case of using the storage circuit 13 and the case of using the storage circuit 13*a* are described below. FIG. 8 shows the operation of cutting the fuse F1 and the operation of detecting the cut fuse F1. As shown in FIG. 8, in the case of using the storage circuit 13*a*, the logic of the ENABLE signal is inverted compared with the case of using the storage circuit 13. In the latch period, when the ENABLE signal becomes the enabling state (Low level), the gating output signal Gate_o which is output from the NOR gate 14*a* changes from Low level to High level. Then, the output of the latch circuit 15*a*, which has been High level in the reset release state, changes to the Low level at the rising edge of the gating output signal Gate_o. Accordingly, the remedial signal becomes Low level.

FIG. 9 shows the case of detecting the state that the fuse F1 is uncut. As shown in FIG. 9, even when the ENABLE signal becomes the enabling state in the latch period, the gating output signal Gate_o which is output from the NOR gate 14*a* stays Low level in this case. Accordingly, the output of the latch circuit 15*a* stays High level.

Second Embodiment

Figure 10:
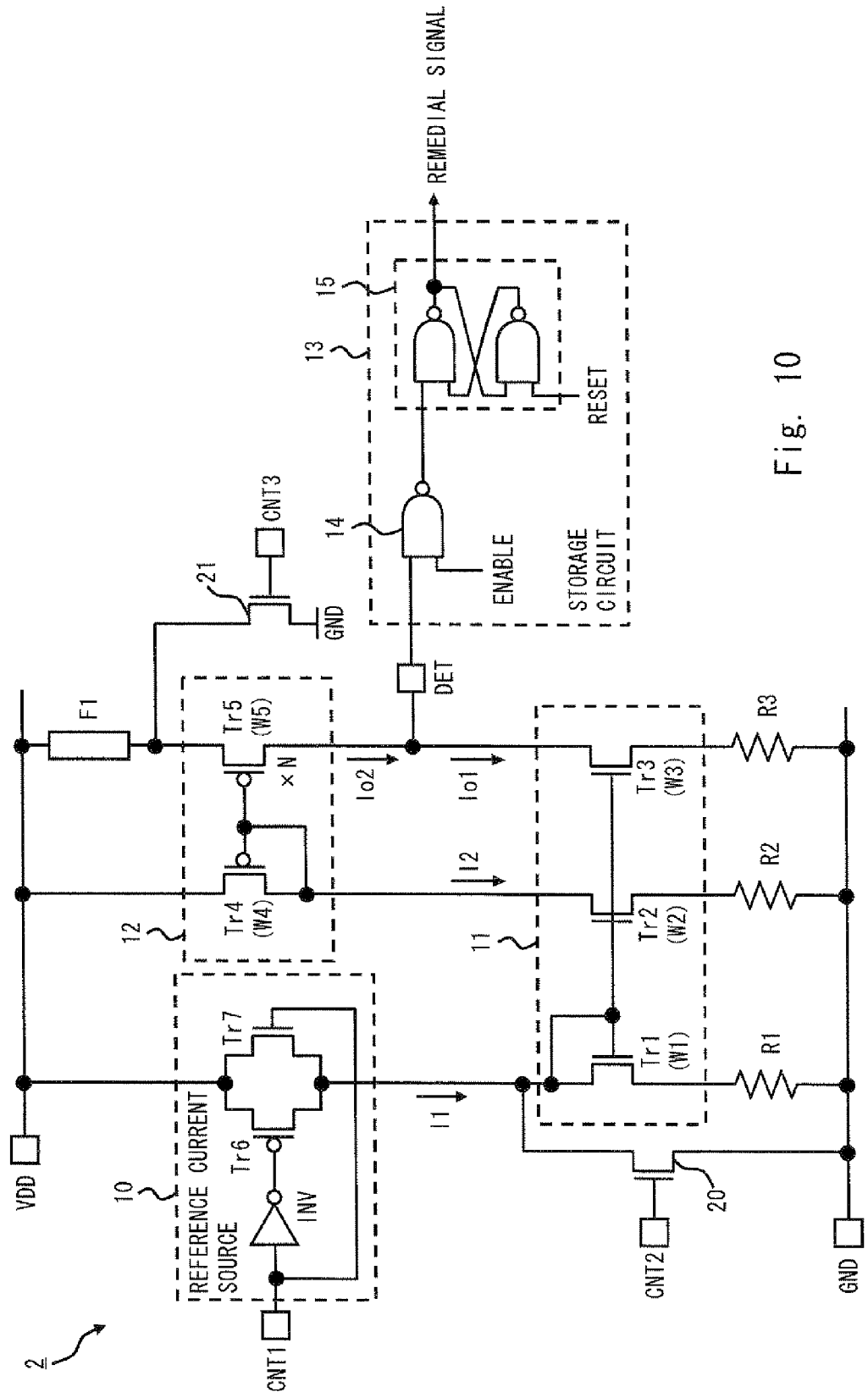
FIG. 10 is a circuit diagram of a fuse circuit according to a second embodiment of the present invention.

FIG. 10 is a circuit diagram of a fuse circuit 2 according to a second embodiment of the present invention. Referring to FIG. 10, in the fuse circuit 2 of the second embodiment, resistors R1 to R3 are connected between the sources of the NMOS transistors Tr1 to Tr3 and the ground line GND, respectively. The resistance of the resistors R1 to R3 may be set to the ratio which corresponds to the size ratio of the NMOS transistors Tr1 to Tr3. Because the size ratio W1:W2:W3 of the NMOS transistors Tr1 to Tr3 is 1:1:1 in this embodiment, the resistance ratio of the resistors R1 to R3 is also set to 1:1:1.

In the current mirror circuit, an error in the mirror ratio between the input current and the return current can be reduced by connecting a resistor to the source of a transistor which constitutes the current mirror. Thus, in the fuse circuit 2 according to the second embodiment, the accuracy of the mirror ratio between the reference current I1 and the intermediate current I2 and the accuracy of the mirror ratio between the reference current I1 and the first output current Io1 are higher than those in the fuse circuit 1. The fuse circuit 2 can thereby detect the uncut/cut state of the fuse F1 more reliably than the fuse circuit 1.

In the fuse circuit 2 according to the second embodiment also, a resistor is not inserted to the source of the transistor whose gate is commonly connected to the transistor to which the fuse F1 is connected. If the resistor is inserted thereto, it may be impossible to accurately detect the uncut/cut state of the fuse F1 by the reconnection of the fuse F1 after the cutting.

Further, the transistors to which the resistors are connected are not limited to those shown in FIG. 10, and they may be appropriately altered according to the transistor to which the fuse F1 is connected. FIG. 11 shows an example of the relationship between the transistor to which the fuse F1 is connected and the transistors to which the resistors can be connected in each case. As shown in FIG. 11, the resistor may be inserted to the transistor which belongs to the current mirror that does not include the transistor to which the fuse F1 is connected.

Third Embodiment

Figure 12:
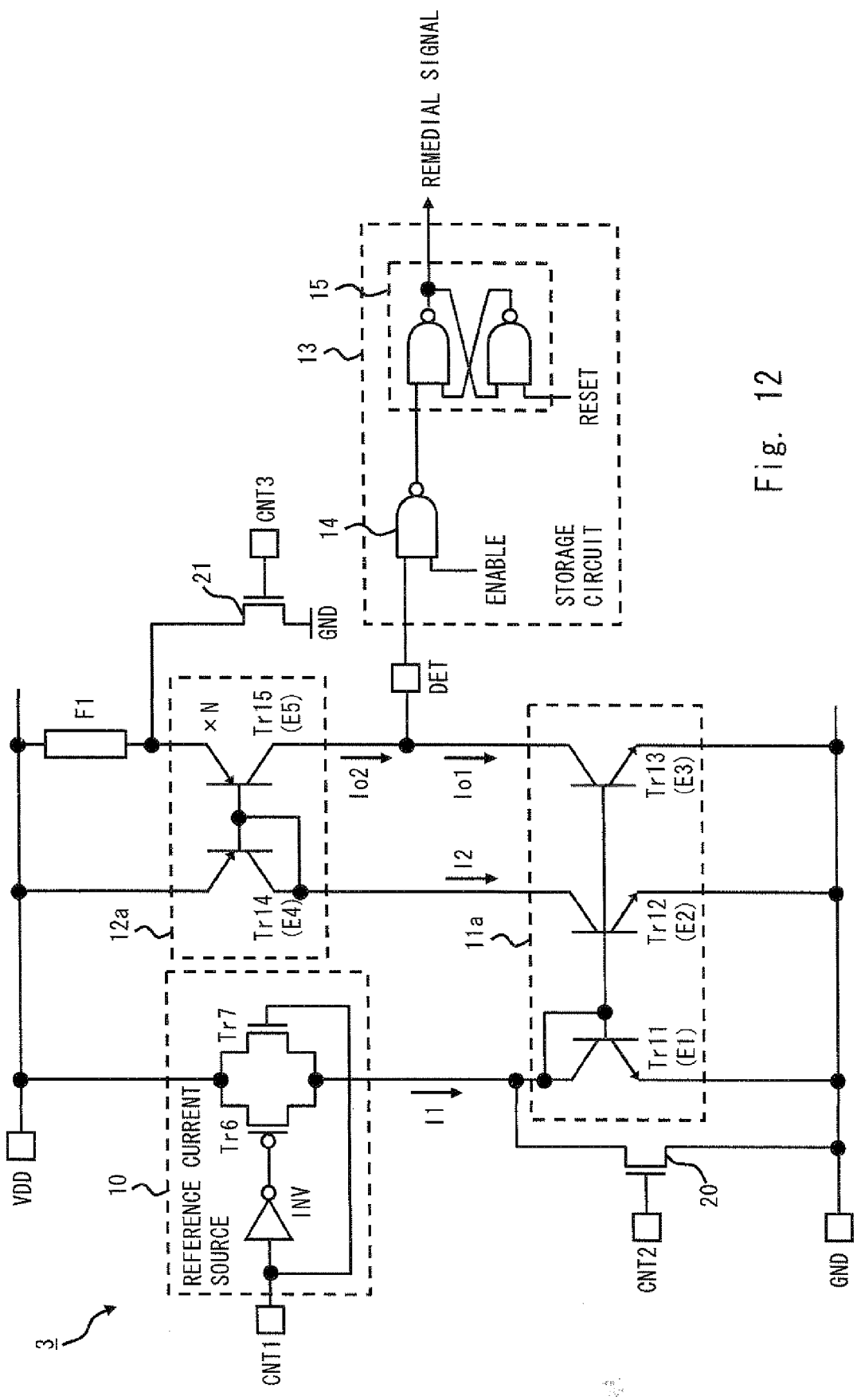
FIG. 12 is a circuit diagram of a fuse circuit according to a third embodiment of the present invention.

FIG. 12 is a circuit diagram of a fuse circuit 3 according to a third embodiment of the present invention. Referring to FIG. 12, the fuse circuit 3 includes a first current mirror 11a and a second current mirror 12a that are formed using bipolar transistors, which are the equivalents of the first current mirror 11 and the second current mirror 12 in the fuse circuit 1. The bipolar transistor has a base as a control terminal which corresponds to the gate of a MOS transistor, a collector as a first terminal which corresponds to the drain, and an emitter as a second terminal which corresponds to the source.

The first current mirror 11a includes NPN transistors Tr11 to Tr13. The NPN transistor Tr11 corresponds to the NMOS transistor Tr1, the NPN transistor Tr12 corresponds to the NMOS transistor Tr2, and the NPN transistor Tr13 corresponds to the NMOS transistor Tr3. In this embodiment, the transistor sizes E1 to E3 of the NPN transistors Tr11 to Tr13 are the same.

The second current mirror 12a includes PNP transistors Tr14 and Tr15. The PNP transistor Tr14 corresponds to the PMOS transistor Tr4, and the PNP transistor Tr15 corresponds to the PMOS transistor Tr5. The transistor size E5 of the PNP transistor Tr15 is N times the transistor size E4 of the PNP transistor Tr14.

The transistor size of the bipolar transistor is determined by the area of the emitter region. Accordingly, the PNP transistor Tr15 has the emitter region which is N times that of the PNP transistor Tr14.

In the current mirror which is composed of bipolar transistors, the mirror ratio of return current is improved than in the current mirror which is composed of MOS transistors. This is because an early voltage is higher in the bipolar transistor than in the MOS transistor. Therefore, the fuse circuit 3 can improve the mirror ratio than the fuse circuit 1, thereby enabling more reliable detection of the uncut/cut state of the fuse based on a current value which is set with high accuracy. In the fuse circuit 3 also, the modification by the change in transistor ratio as shown in FIG. 5 and the addition of resistors as shown in FIG. 11 is possible.

Fourth Embodiment

Figure 13:
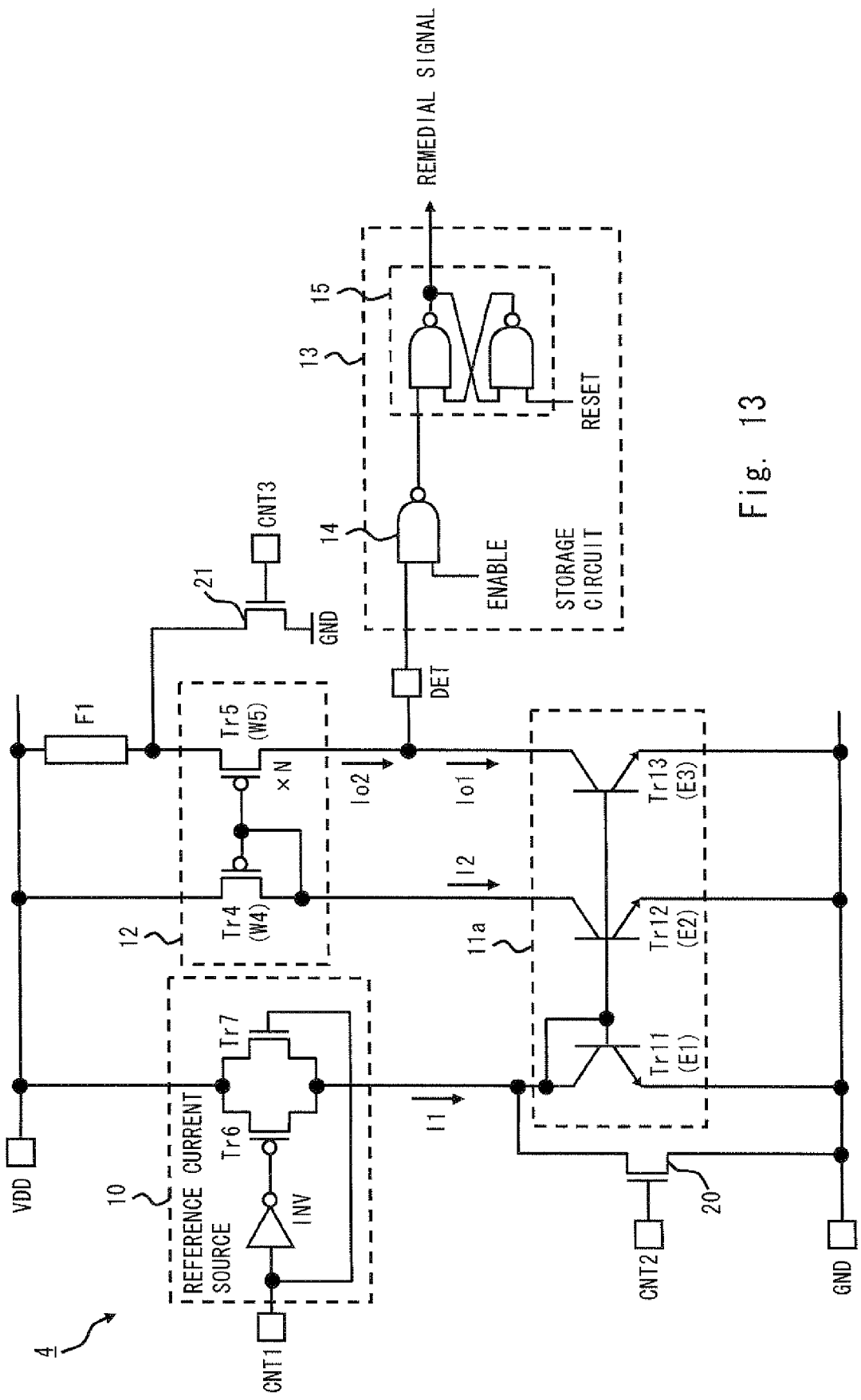
FIG. 13 is a circuit diagram of a fuse circuit according to a fourth embodiment of the present invention.

FIG. 13 is a circuit diagram of a fuse circuit 4 according to a fourth embodiment of the present invention. Referring to FIG. 13, the fuse circuit 4 includes the first current mirror 11a and the second current mirror 12. Thus, in the fuse circuit 4, the first current mirror and the second current mirror are composed of transistors in different forms. With such a structure of current mirror as well, the same advantage as in the above embodiments can be obtained by setting the magnitude relationship of the first output current Io1 and the second output current Io2 based on the size ratio of the transistors. The transistors which constitute one current mirror are preferably in the same form. In the fuse circuit 4 also, the modification by the change in transistor ratio as shown in FIG. 5 and the addition of resistors as shown in FIG. 11 is possible.

Fifth Embodiment

Figure 14:
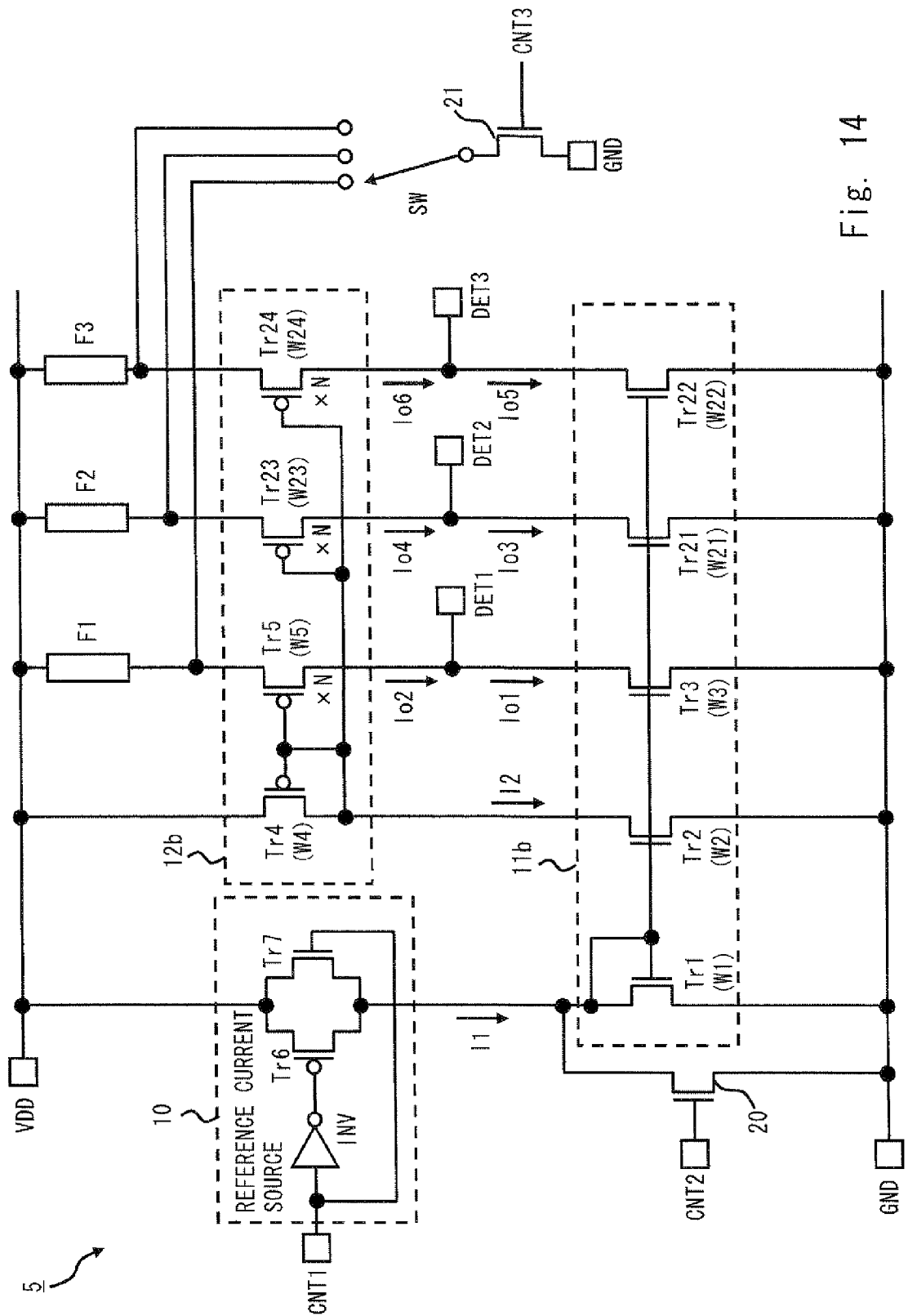
FIG. 14 is a circuit diagram of a fuse circuit according to a fifth embodiment of the present invention.

FIG. 14 is a circuit diagram of a fuse circuit 5 according to a fifth embodiment of the present invention. Referring to FIG. 14, the fuse circuit 5 includes a plurality of fuses (F1 to F3 in FIG. 14). The fuse circuit 5 further includes a first current mirror 11b as the first current source and a second current mirror 12b as the second current source. In FIG. 14, a terminal which corresponds to the output terminal DET is an output terminal DET1.

The first current mirror 11b has such a structure that NMOS transistors Tr21 and Tr22 are added to the first current mirror 11. The gates of the NMOS transistors Tr21 and Tr22 are commonly connected to the gate of the NMOS transistor Tr1, and the sources are connected to the ground line GND. The drain of the NMOS transistor Tr21 is connected to an output terminal DET2. The drain of the NMOS transistor Tr22 is connected to an output terminal DET3.

The second current mirror 12b has such a structure that PMOS transistors Tr23 and Tr24 are added to the second current mirror 12. The gates of the PMOS transistors Tr23 and Tr24 are commonly connected to the gate of the PMOS transistor Tr4. The source of the PMOS transistor Tr23 is connected to the power supply line VDD via the fuse F2, and the drain is connected to the output terminal DET2. The source of the PMOS transistor Tr24 is connected to the power supply line VDD via the fuse F3, and the drain is connected to the output terminal DET3.

Thus, the fuse circuit 5 has such a structure that the fuses F2 and F3 are added to the fuse circuit 1, and the first and the second current sources are further added corresponding thereto. In this embodiment, the NMOS transistor Tr21 and the PMOS transistor Tr23 are disposed as the first and the second current sources, respectively, which correspond to the fuse F2, and the NMOS transistor Tr22 and the PMOS transistor Tr24 are disposed as the first and the second current sources, respectively, which correspond to the fuse F3.

In this embodiment, the relationship between first output current Io3 which is output from the NMOS transistor Tr21 and second output current Io4 which is output from the PMOS transistor Tr23 is Io3<Io4 when the fuse F2 is uncut, and it is Io3>Io4 when the fuse F2 is cut. Further, the relationship between first output current Io5 which is output from the NMOS transistor Tr22 and second output current Io6 which is output from the PMOS transistor Tr24 is Io5<Io6 when the fuse F3 is uncut, and it is Io5>Io6 when the fuse F3 is cut. The output current is set based on the transistor size ratio of each transistor as in the first embodiment. In this embodiment, the transistor sizes of the PMOS transistors Tr23 and Tr24 are N times the size just like the PMOS transistor Tr5, and the transistor sizes of the other transistors are one time the size.

Further, in this embodiment, a switch SW is connected between the drain of the fuse cutting transistor 21 and the fuses F1 to F3. The switch SW selects the fuse to cut and connects the fuse cutting transistor 21 to the selected fuse.

As described above, in the fuse circuit 5, the first and the second current mirrors in the fuse circuit 1 are modified so as to correspond to the plurality of fuses. Thus, the fuse circuit 5 can reliably detect the fuse cut state, just like the fuse circuit 1. Further, the fuse circuit 5 can detect the cut state of a plurality of fuses with the use of one reference current source. It is thereby possible to detect the cut state of a plurality of fuses without preparing the same number of reference current sources as the fuses. This suppresses an increase in the power consumption and the circuit area with respect to an increase in the number of fuses.

Sixth Embodiment

Figure 15:
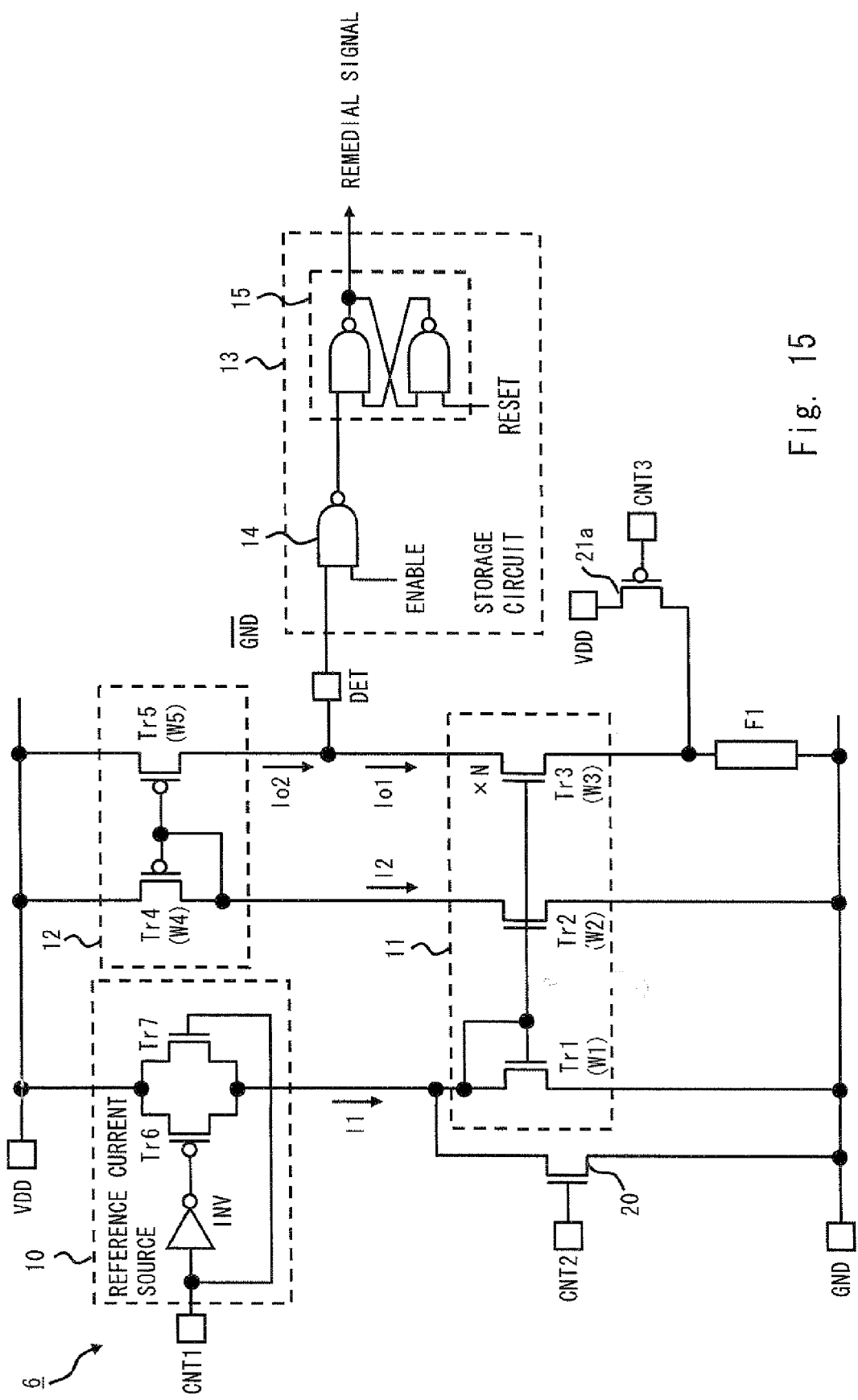
FIG. 15 is a circuit diagram of a fuse circuit according to a sixth embodiment of the present invention.

FIG. 15 is a circuit diagram of a fuse circuit 6 according to a sixth embodiment of the present invention. Referring to FIG. 15, the fuse circuit 6 is an example of the case where the fuse F1 is connected to the NMOS transistor Tr3 in the table shown in FIG. 5. In this embodiment, the transistor size ratio of the NMOS transistor Tr3 is N times that of the other transistors. The first current source is the second current mirror 12, and the second current source is the first current mirror 11 in this embodiment. Further, the first power supply line is the ground line GND, and the second power supply line is the power supply line VDD.

Further, the fuse circuit 6 includes a fuse cutting transistor 21a which is connected in accordance with the connected portion of the fuse F1. The fuse cutting transistor 21a is composed of a PMOS transistor. The gate of the fuse cutting transistor 21a is connected to the control terminal CNT3, the source is connected to the power supply line VDD, and the drain is connected to the node between the fuse F1 and the source of the NMOS transistor Tr3.

Thus, in the case of connecting the fuse between the first current mirror 11 and the ground line GND in the fuse circuit 1, the connection of the fuse cutting transistor is changed according to the connected portion of the fuse as in the fuse circuit 6.

Seventh Embodiment

Figure 16:
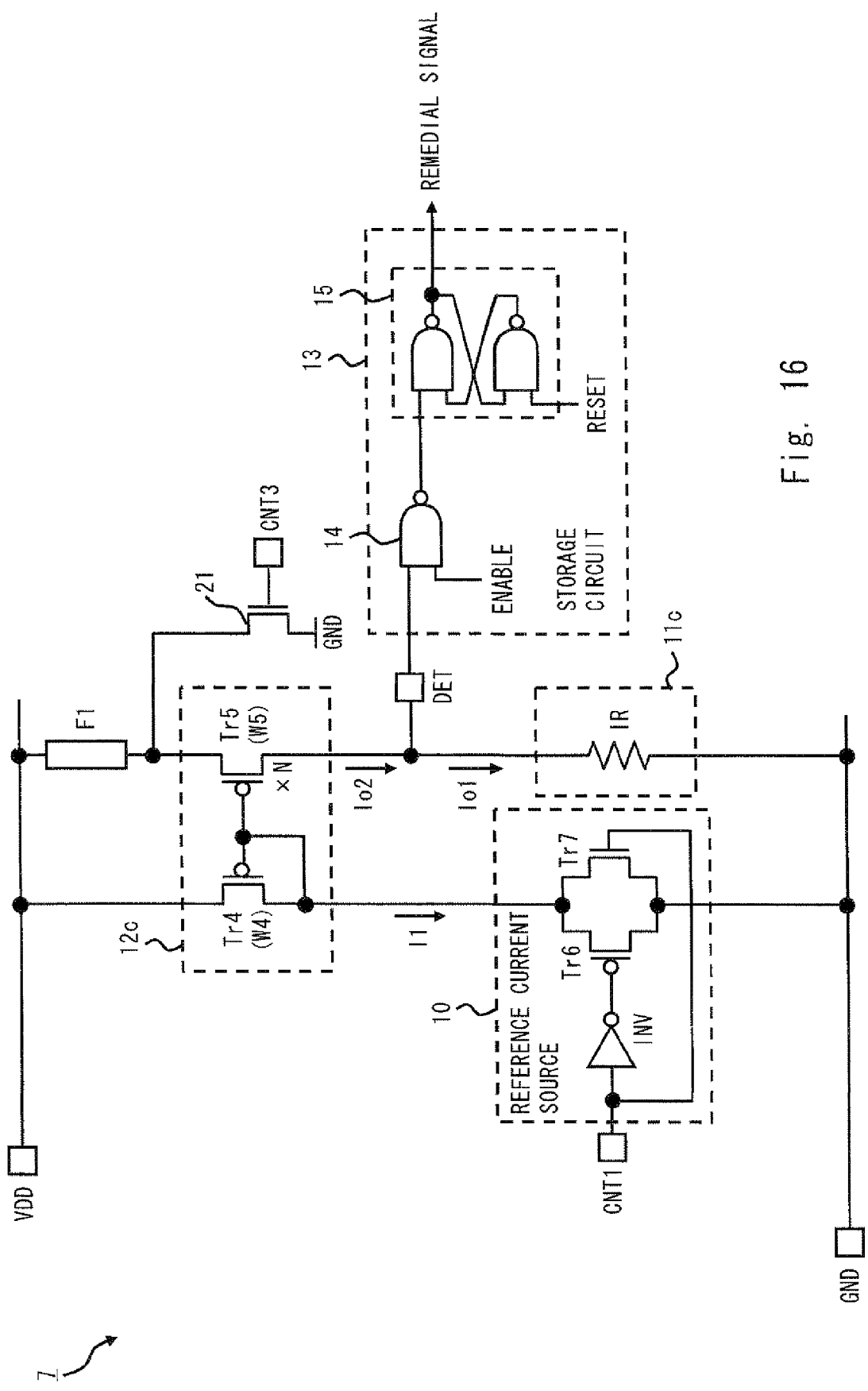
FIG. 16 is a circuit diagram of a fuse circuit according to a seventh embodiment of the present invention.

FIG. 16 is a circuit diagram of a fuse circuit 7 according to a seventh embodiment of the present invention. Referring to FIG. 16, the fuse circuit 7 uses a resistor IR (which is indicated by the symbol 11c in FIG. 16) as the first current source and a current mirror 12c as the second current source. Further, the reference current source 10 is connected between the current mirror 12c and the ground line GND in this embodiment.

The resistor IR is connected between the output terminal DET and the ground line GND. The resistor IR draws in the first output current Io1 according to the voltage value of the output terminal DET. In other words, the first current source has the current draw-in capacity according to the voltage value of the output terminal DET. The resistance of the resistor IR is preferably such a value that the voltage value of the output terminal DET increases to the power supply voltage by the second output current Io2, which is described later.

The current mirror 12c is a current mirror circuit which is composed of the PMOS transistors Tr4 and Tr5. The gate and the drain of the PMOS transistor Tr4 are commonly connected, and the source is connected to the power supply line VDD through a line. The drain of the PMOS transistor Tr4 is also connected to the reference current source 10. The gate of the PMOS transistor Tr5 is connected to the gate of the PMOS transistor Tr4, the source is connected to the power supply line VDD via the fuse F1, and the drain is connected to the output terminal DET. In this embodiment, the transistor size ratios of the PMOS transistors Tr4 and Tr5 are the same. Thus, the second output current Io2 which is output from the PMOS transistor Tr5 is the same amount as the current I1 which is output from the reference current source 10. Alternatively, the transistor size ratio may be changed so that the current amount is different between the current I1 and the second output current Io2.

The operation of the fuse circuit 7 is described hereinafter. The operation concerning the storage circuit 13 is not described below because it is the same as that described in the first embodiment. The voltage value of the output terminal DET when the fuse F1 is cut and when it is uncut is described hereinbelow.

When the fuse F1 is cut, the resistance of the fuse F1 is significantly higher than the resistance of the line which connects the PMOS transistor Tr4 and the power supply line VDD, so that the second output current Io2 becomes substantially zero. On the other hand, the first output current Io1 is drawn out from the output terminal DET by the resistor IR which is connected to the output terminal DET, so that the voltage value of the output terminal DET becomes the ground voltage. Accordingly, the voltage value of the output terminal DET is the ground voltage when the fuse F1 is cut.

On the other hand, when the fuse F1 is uncut, the resistance of the fuse F1 is substantially the same as the resistance of the line which connects the PMOS transistor Tr4 and the power supply line VDD, so that the second output current Io2 is substantially the same as the current I1. Therefore, the second output current Io2 flows into the resistor IR, so that the voltage value of the output terminal DET increases to the power supply voltage. Accordingly, the voltage value of the output terminal DET is the power supply voltage when the fuse F1 is uncut.

As described above, the fuse circuit 7 in which the first current source is composed of the resistor IR can reliably detect the conducting state of the fuse by reversing the relationship of the first output current Io1 and the second output current Io2 according to the conducting state of the fuse. Further, in the fuse circuit 7 also, the fuse F1 is connected to the source of one transistor in the second current mirror, and the source of the other transistor is connected to the power supply line through a line. In such a structure, even if the fuse F1 is reconnected after it is cut, a large difference in resistance is generated between the fuse and the line, and therefore there is substantially no increase in the second output current Io2 due to the reconnection. The detection accuracy for the fuse F1 is thereby improved in the fuse circuit 7 as well. Accordingly, the fuse circuit 7 has improved reliability as the circuit which detects the cut state of the fuse.

It is apparent that the present invention is not limited to the above embodiments, but may be modified and changed without departing from the scope and spirit of the invention.

Figure 17:
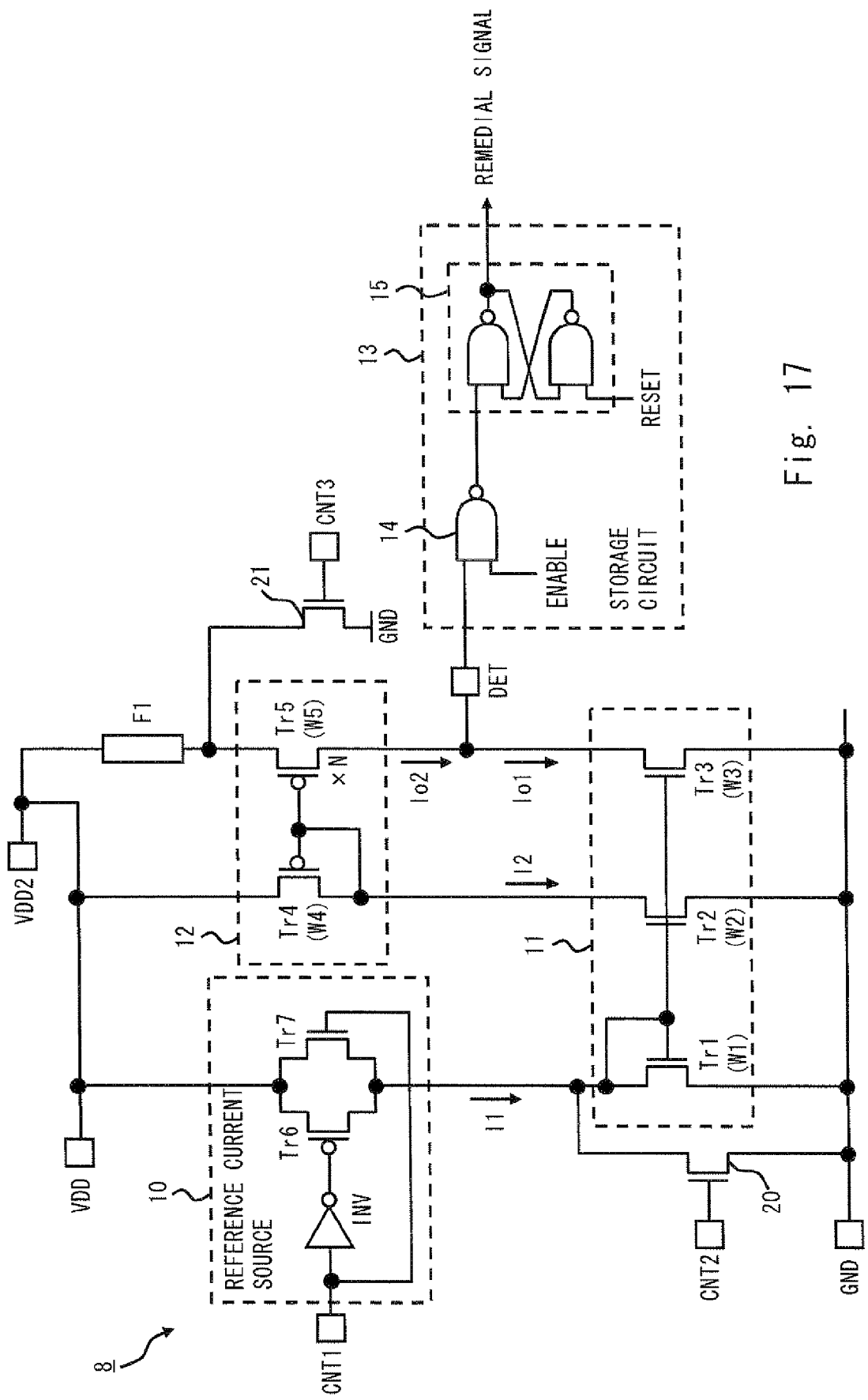
FIG. 17 is a circuit diagram showing another example of a fuse circuit according to an embodiment of the present invention.
Figure 18:
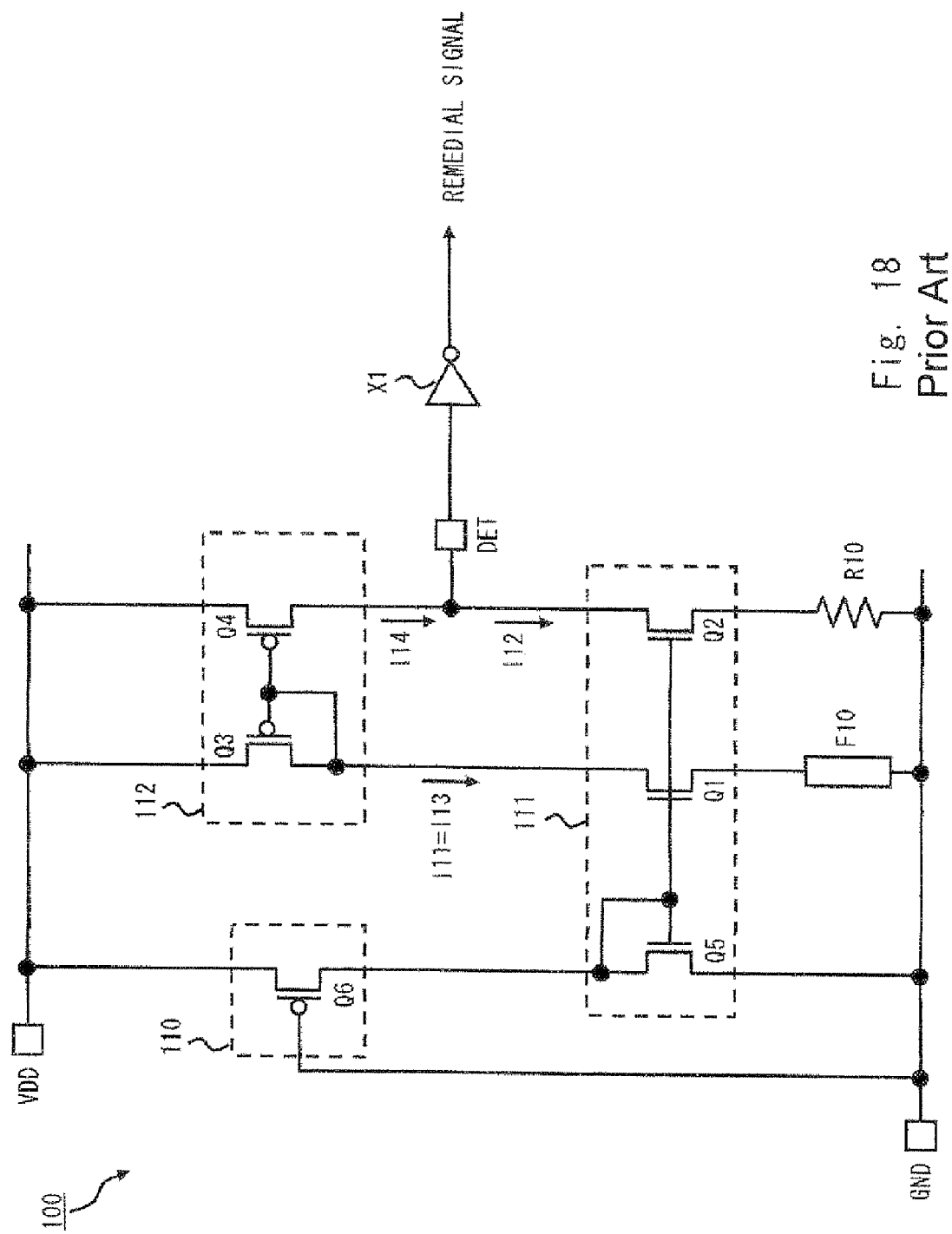
FIG. 18 is a circuit diagram of a fuse circuit according to a related art.

For example, if a higher voltage than a normal power supply voltage is needed when cutting the fuse F1, a power supply line VDD2 may be placed in addition to the power supply line VDD. FIG. 17 shows a circuit diagram of a fuse circuit 8 which includes the power supply line VDD2. It is thereby possible to supply a voltage that is high enough to cut the fuse F1 from the power supply line VDD2, which improves the reliability as the circuit that detects the cut state of the fuse F1.

What is claimed is:
1. A fuse circuit, comprising:
a first power supply line;
a second power supply line;

a first transistor coupled between said first and second power supply lines to output a first output current;

a second transistor coupled between said first and second power supply lines and coupled to said first transistor to output a second output current;

a fuse coupled in series with said first transistor or said second transistor between said first and second power supply line;

another fuse coupled to said second power supply line;

an output terminal coupled to a node between said first and second transistors to output a signal in accordance with a magnitude relationship of the first output current and the second output current, wherein said magnitude relationship is inverted based on a size ratio of said second transistor and whether said fuse is cut or not;

a fuse cutting transistor coupled in series with said fuse between said first and second power supply lines;

a switch coupled to said fuse cutting transistor and selectively coupled to one of said fuse and said another fuse; and an additional transistor coupled to a node between said another fuse and said switch.

2. The fuse circuit according to claim 1, further comprising:

a resistor coupled in series with said first transistor.

3. The fuse circuit according to claim 1, wherein said first transistor is an MOS transistor or a bipolar transistor, and said second transistor is an MOS transistor or a bipolar transistor.

4. The fuse circuit according to claim 3, wherein said first transistor is a bipolar transistor and said second transistor is an MOS transistor.

5. The fuse circuit according to claim 1, further comprising:

a third transistor coupled between said first and second power supply lines and coupled to said second transistor to function as a first current mirror circuit with said second transistor.

6. The fuse circuit according to claim 5, further comprising:

a fourth transistor coupled between said first and second power supply lines and coupled to said third transistor and said first transistor to function as a second current mirror circuit with said first transistor.

7. The fuse circuit according to claim 6, further comprising:

a transfer gate coupled between said first and second power supply line; and a fifth transistor coupled to said first power supply line and further coupled to a node between said transfer gate and said fourth transistor.

8. The fuse circuit according to claim 1, wherein said size ratio of said second transistor is set so that said magnitude relationship is inverted based on whether said fuse is cut or not.

9. The fuse circuit according to claim 1, further comprising:

a storage circuit coupled to said output terminal to latch a value of said signal.

10. The fuse circuit according to claim 6, wherein a size ratio of said second transistor is the same as a size ratio of said fourth transistor.

* * * * *